(12) United States Patent
Adut (10) Patent No.: US 8,446,203 B1
(45) Date of Patent: May 21, 2013

(54) CURRENT CONTROLLED FAST LOW-SIDE CLAMP

(75) Inventor: Jozef Adut, Sunnyvale, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 13/482,760

(22) Filed: May 29, 2012

(51) Int. Cl.
*H03L 5/00* (2006.01)

(52) U.S. Cl.
USPC .......................... 327/318; 327/321; 327/327

(58) Field of Classification Search
USPC ......................................... 327/318, 321, 327
See application file for complete search history.

(56) References Cited

U.S. PATENT DOCUMENTS

| | | | |
|---|---|---|---|
| 4,069,460 A | 1/1978 | Sauer | |
| 4,714,896 A | 12/1987 | Addis | |
| 5,966,006 A * | 10/1999 | Migliavacca | 323/315 |
| 7,994,858 B2 * | 8/2011 | Standley et al. | 330/253 |
| 8,159,278 B2 * | 4/2012 | Rankin et al. | 327/313 |

* cited by examiner

*Primary Examiner* — Kenneth B. Wells
(74) *Attorney, Agent, or Firm* — Brian D. Ogonowsky; Patent Law Group LLP (57) ABSTRACT

A low side clamp circuit has a control portion, a sense portion, and a clamp portion. When the sense portion detects that the input voltage of an output stage of a buffer has gone below a threshold voltage, it triggers the control portion to quickly turn on a clamp transistor (in the clamp portion) to clamp the output voltage to the clamp voltage. The control portion and sense portion have cross-coupled transistors that create increased speed and a sharp response with little or no voltage offset with a wide range of load currents. A clamp current source draws current through a resistor coupled in series between the base of the output transistor in the control portion and the collector of the output transistor in the sense portion. The clamp current is set to ClLo/R, where ClLo is the clamp voltage. A high side clamp is also described.

11 Claims, 6 Drawing Sheets

CURRENT CONTROLLED FAST LOW-SIDE CLAMP

FIELD OF THE INVENTION

This invention relates to voltage clamps and, in particular, to a fast and accurate low-side voltage clamp circuit that sets the minimum voltage at an output of another circuit.

BACKGROUND

In certain applications, it is desirable to control the highest level and the lowest level of an input signal. This is referred to as high-side and low-side clamping. High-side clamping may be used to limit the input signal to a device to avoid damage. Such a device may be an analog-to-digital converter (ADC). If the input signal is a differential signal, low-side clamping may be used to create a symmetrical differential input signal around a common mode voltage when the high-side is clamped. The clamping also limits the maximum range input signal to the ADC. Low-side clamping may also be used to set a minimum voltage into a downstream device to ensure proper operation of the downstream device.

Figure 1:
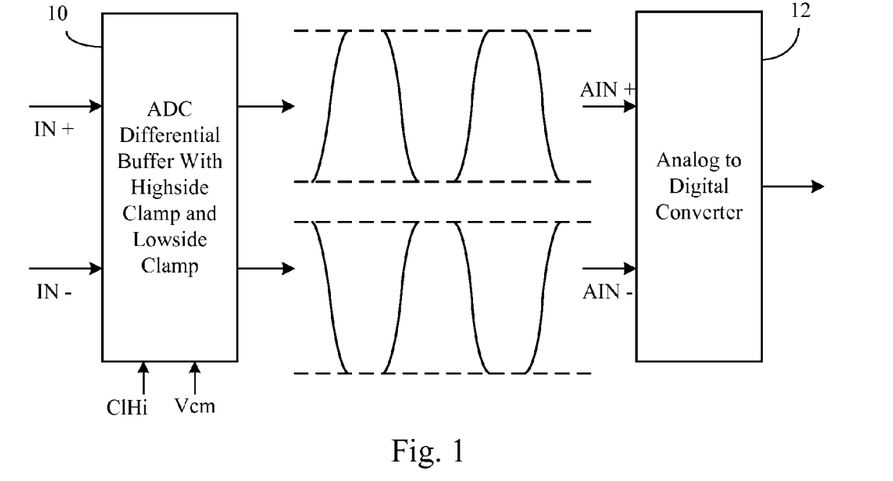
FIG. 1 illustrates a buffer having high-side and low-side clamps, where the buffer may contain the present invention.

FIG. 1 illustrates a buffer 10 (a driver) receiving an analog differential input signal (IN+ and IN−), assumed to be sine waves. The buffer 10 generates analog differential output signals AIN+ and AIN− that are clamped for receiving by a particular ADC 12. The user selects the particular ADC 12 and may select the clamping requirements for the ADC 12 by providing certain control signals to the ClHi (clamp high-side) input terminal and Vcm (common mode voltage) input terminal of the buffer 10. In one embodiment, the buffer 10 may automatically adjust the low-side clamp voltage, since the high-side clamp and low-side clamp voltages are assumed to be symmetrical around the common mode voltage. The dashed lines above and below the sine waves signify the high-side and low-side clamp voltages. Any input signal above or below the clamp voltages is clamped to the respective clamp voltage.

Figure 2:
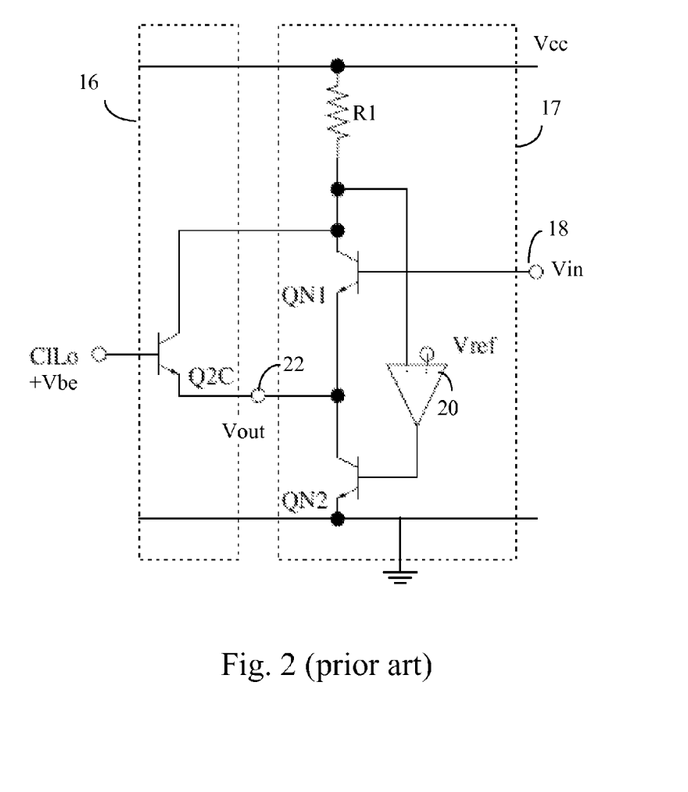
FIG. 2 illustrates a conventional low-side clamp transistor connected in parallel with an output transistor in an output stage of a buffer.

FIG. 2 illustrates a conventional low-side clamp circuit 16 coupled to an emitter follower output stage 17 of a buffer, such as buffer 10. An input signal Vin at terminal 18 is coupled to the base of the NPN transistor QN1. Current flows through resistor R1, transistor QN1, and transistor QN2 between the supply voltage Vcc and ground. A high gain differential amplifier 20 has an inverting input coupled to a reference voltage Vref and a non-inverting input coupled to the resistor R1. The output of the differential amplifier 20 is coupled to the base of transistor QN2. The differential amplifier 20 uses feedback to control the current through transistor QN2 and resistor R1 such that the voltage at the resistor R1 equals the reference voltage Vref. The amplifier 20 maintains a constant collector current for transistor QN1.

The output voltage Vout is clamped to a desired low-side clamp voltage (ClLo) when Vin-Vbe tries to go below the clamp voltage. The user or the buffer sets ClLo by coupling the value ClLo+Vbe to the base of transistor Q2C. ClLo+Vbe is generated by a conventional voltage source. The transistor Q2C is connected in parallel with transistor QN1 by sharing its emitter and collector regions. The transistors are scaled to have the same current density when on. Therefore, they may have different areas to cause them to conduct different currents with the same Vbe. The transistor Q2C turns on when the voltage at its emitter reaches ClLo and supplies current to the load connected to the output terminal 22. Thus, the output voltage Vout cannot go below ClLo, and Vout is the maximum of ClLo or Vin-Vbe. The output impedance of transistor Q2C limits the accuracy of the clamp voltage.

One problem with the clamp circuit 16 is that is does not have a sharp response as Vin-Vbe approaches the clamp voltage, due to the clamp transistor Q2C not having a precise turn-on voltage. A sharp and accurate response is desired for an accurate low-side clamp voltage, especially when used in a buffer for a precision ADC.

Another problem with such "voltage mode" clamp circuits is that the clamp voltage, if too low, may cause a current source in the circuit that generates the value ClLo+Vbe to saturate. This creates a voltage offset in the clamp circuit.

Another problem with conventional low-side clamp circuits is that a varying offset between the intended clamp voltage and the actual clamp voltage may occur with varying load currents when the output is clamped.

What is needed is an accurate low-side clamp circuit with a sharp response to an input voltage falling below the clamp voltage and which can generate a very low clamp voltage.

SUMMARY

A low-side clamp circuit is disclosed. Bipolar transistors are used in the example, but other types of transistors may be used. The clamp circuit comprises a control portion, a sense portion, and a clamp portion. When the sense portion detects that the input voltage of an output stage of a buffer has gone below a threshold voltage, it triggers the control portion to quickly turn on a clamp transistor (in the clamp portion) to clamp the output voltage to the clamp voltage. There is very little current flow through the sense circuit when the clamp transistor is off.

The control portion and sense portion have cross-coupled transistors that bring about the increased speed and sharp response with little or no voltage offset with a wide range of load currents. The base of the sense portion output transistor is coupled to the collector of the control portion output transistor, and the collector of the sense portion output transistor is coupled to the base of the control portion output transistor via a resistor.

Instead of a clamp voltage being generated by a voltage source, a clamp current source is used, which draws current through the resistor coupled in series between the base of the output transistor in the control portion and the collector of the output transistor in the sense portion. Since the minimum voltage at the base of the output transistor in the control portion is a Vbe above ground, the clamp current source will not saturate under any condition. The clamp current is set to ClLo/R. Various other advantages arise by using a current controlled clamp circuit, including the ability to compensate for offsets with varying load currents.

Various other embodiments are described. One alternative circuit compensates for base currents in the sense portion siphoning off current in the control portion so that a high current output does not cause an offset voltage. Another alternative circuit compensates for voltage drops across the resistor to avoid an offset. Another alternative circuit places a diode between the clamp current source and a node in the control portion of the clamp circuit to prevent a reverse breakdown of the base-emitter junction of the clamp transistor in the event that the low-side clamp voltage is set to high. Features of the various circuits may be combined together.

BRIEF DESCRIPTION OF THE DRAWINGS

Elements that are the same or equivalent are labeled with the same numeral.

DETAILED DESCRIPTION

Figure 3:
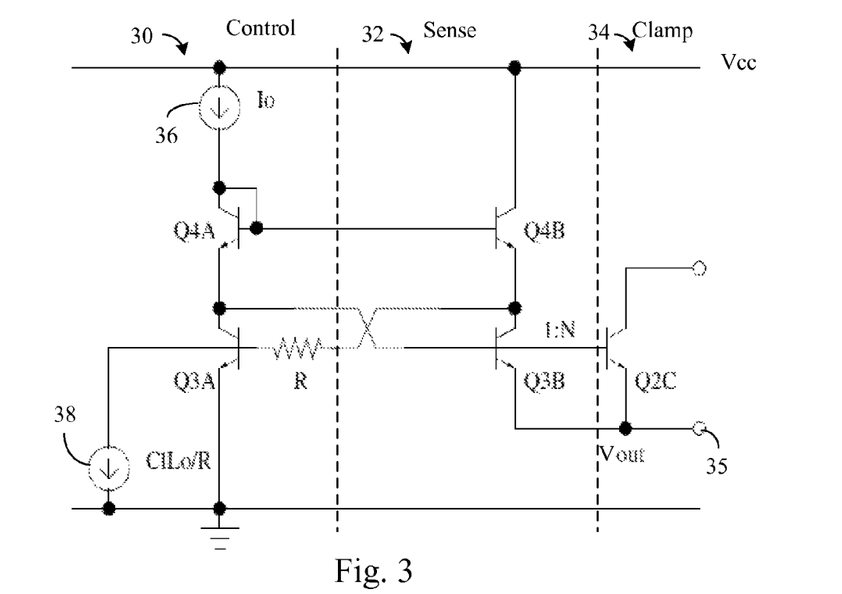
FIG. 3 illustrates a low-side clamp in accordance with one embodiment of the invention, where the clamp has a sharp and accurate response even with varying load currents. The clamp may be connected to the output stage of FIG. 2.

FIG. 3 illustrates a low-side clamp circuit, in accordance with one embodiment of the invention, having a control portion 30, a sense portion 32, and a clamp portion 34. The collector and emitter of the clamp transistor Q2C are connected across the output transistor QN1 in FIG. 2, in one embodiment, or may share the collector and emitter of the output transistor QN1. In other embodiments, the clamp transistor Q2C may be connected across any transistor in an output voltage which is to be clamped. The output stage will typically be an emitter follower output stage.

In one embodiment, all the transistors in the control and sense portions are the same. In another embodiment, the areas of the transistors may be different to select the relative currents through the transistors.

The function of the circuit is to clamp the voltage at the output terminal 35 to the low-side clamp voltage ClLo, when the input voltage Vin (FIG. 2) applied to the input terminal 18 of FIG. 2 falls below ClLo+Vbe. The clamp transistor Q2C then turns on and supplies most or all of the current to the load connected to the output terminal 35.

Transistors Q3B and Q2C are off and draw no current when there is no clamping action. The remaining transistors Q3A, Q4A, and Q4B draw only a small quiescent current when there is no clamping action.

The current through transistors Q4A and Q3A is set by the current source 36 generating current Io, so that their Vbe are fairly constant. The transistor Q4A has its collector shorted to its base to act as a diode.

When there is no clamping (transistor Q3B is off), the current through the transistor Q4B is set by the current source 38, generating the current ClLo/R, and the base current of transistor Q3A. The current source 38 current is typically set by the user or the buffer to set the clamp voltage. The base of transistor Q3A is also connected to the current source 38. The voltage at the base of the transistor Q3A is Vbe. The current ClLo/R generated by the current source 38 is set so that the voltage at the emitter of transistor Q4B is the low-side clamp voltage ClLo plus Vbe. The voltage across the resistor R is therefore ClLo.

Since the voltage at the emitter of transistor Q4B is ClLo+Vbe, the combined Vbe voltage drops of transistors Q4B and Q4A cause the voltage at the base of transistor Q3B to also be ClLo+Vbe. Since the bases and emitters of transistors Q3B and Q2C are made common, any input voltage Vin (FIG. 2) below ClLo+Vbe will cause the emitters of transistors Q3B and Q2C to drop below ClLo, causing them to turn on and clamp the output terminal 35 at ClLo.

When transistor Q3B begins to turn on so will transistor Q4B, thus raising the base voltage of transistor Q4B and the emitter voltage of transistor Q4A. This raised emitter voltage is coupled to the bases of transistors Q3B and Q2C turning them on harder so as to provide a very fast and precise turn on threshold for the clamp transistor Q2C.

To reduce the current through the clamp circuit while allowing a high load current to flow through the clamp transistor Q2C, the area of transistor Q3B can be made much smaller than the area of transistor Q2C to obtain a 1:N ratio of the currents. In one embodiment, N equals 4.

The cross-coupling of the transistors Q3A and Q3B also substantially compensates for the varying Vbes of the transistors Q4B and Q3B as the current increases through these transistors during clamping. For example, during clamping when the current through transistors Q4B and Q3B has increased and their Vbes have increased, the summed voltage drop around the base-emitter loop of Q4B (up a Vbe), Q4A (down a Vbe), and Q3B (down a Vbe) is substantially constant despite the Vbes of transistors Q4B and Q3B increasing with increased current. Therefore, the clamp voltage at the output terminal 35 will be substantially the same at high load currents and low load currents, allowing the user to precisely set the clamp voltage by setting the current source 38 to generate a current of ClLo/R.

As seen, there is a sharper and more accurate response by the clamp circuit of FIG. 3 compared to the circuit of FIG. 2. By using a current source 38 instead of a voltage source, ClLo can be made very low (close to ground), even with high current densities, without causing the saturation of any components forming part of a voltage source (where the saturation leads to offsets in the clamp voltage).

FIGS. 4-7 illustrate improvements to the circuit of FIG. 3 by compensating for any offsets caused by the base currents in the control portion 30 and sense portion 32.

The betas of the various transistors in FIG. 3 are assumed to be 100 or higher. Therefore, the base currents will be about $\frac{1}{100}^{th}$ of the collector currents. These small base currents in transistors Q3B and Q4B add some small error (offset) since they tap off current from the control portion 30 current path, which is designed for conducting a constant current Io (by current source 36). For the highest precision, such base currents, which vary during operation and with temperature, should be compensated for.

Figure 4:
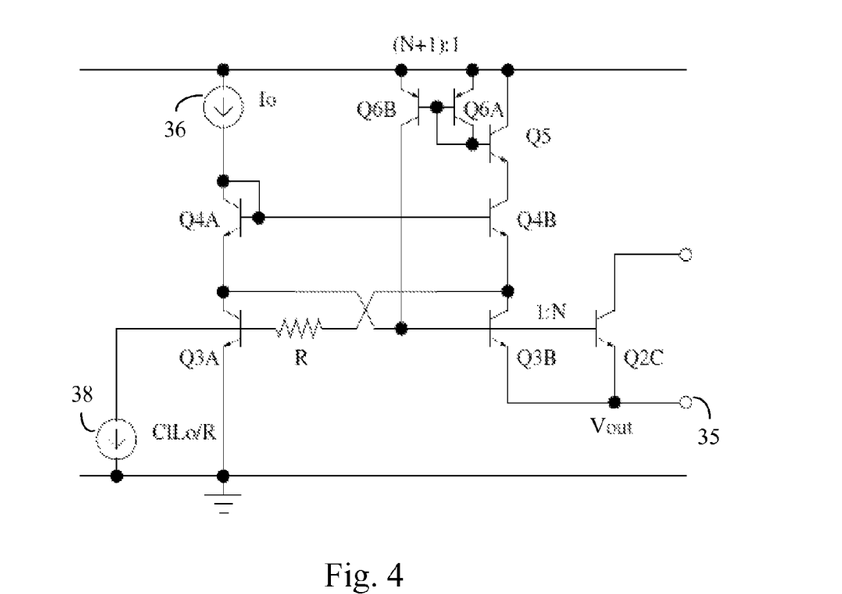
FIG. 4 illustrates an improvement to the clamp of FIG. 3 by adding a circuit to compensate for the base currents of transistors Q2C and Q3B.

FIG. 4 illustrates an improvement to FIG. 3 in that it compensates for the transistors' Q2C and Q3B base currents being tapped off the emitter of transistor Q4A. A transistor Q5 is connected in series with transistors Q4B and Q3B. PNP transistors Q6A and Q6B are connected as a current minor, and the collector of transistor Q6B is connected to the base of transistor Q3B. Transistors Q5 and Q3B are matched so that they have the same base currents. The base current to transistor Q5 is supplied by transistor Q6A, which causes the transistor Q6B to supply a proportional base current to the base of transistor Q3B. The size of transistor Q6B is selected to be N+1 the size of transistor Q3B to supply the base currents to both transistors Q3B and Q2C. In one example, transistor Q2C is four times (N=4) the size of transistor Q3B, so the size of transistor Q6B is five times the size of transistor Q6A. Therefore, no base current to transistors Q3B and Q2C is tapped off the current source 36 (generating Io) so that the current flow through transistors Q4A and Q3A is more constant. This results in stable Vbes of transistors Q4A and Q3B with varying output load currents and, thus, reduces any clamp voltage offset due to varying base currents (resulting from the varying load currents).

The base current of transistor Q4B also taps off current from the current source 36 and creates some small undesired offset due to the base current varying the current through the transistors Q4A and Q3A. The circuit of FIG. 5 compensates for the base current of transistor Q4B by adding transistor Q7. The base of transistor Q7 is connected to the collector of transistor Q4A, its collector is connected to the supply voltage, and its emitter is connected to the bases of transistors Q4A and Q4B. The current through transistor Q7 supplies the base current to transistors Q4A and Q4B, where the base current is that needed to cause transistor Q4A to conduct the current Io. Therefore, rather than the current source 36 supplying all of the base current for transistor Q4B (as in FIG. 3), it is only supplying $1/100^{th}$ of that current to the base of transistor Q7. Thus, the current through transistors Q4A and Q3A is more constant despite variations in load currents.

Figure 5:
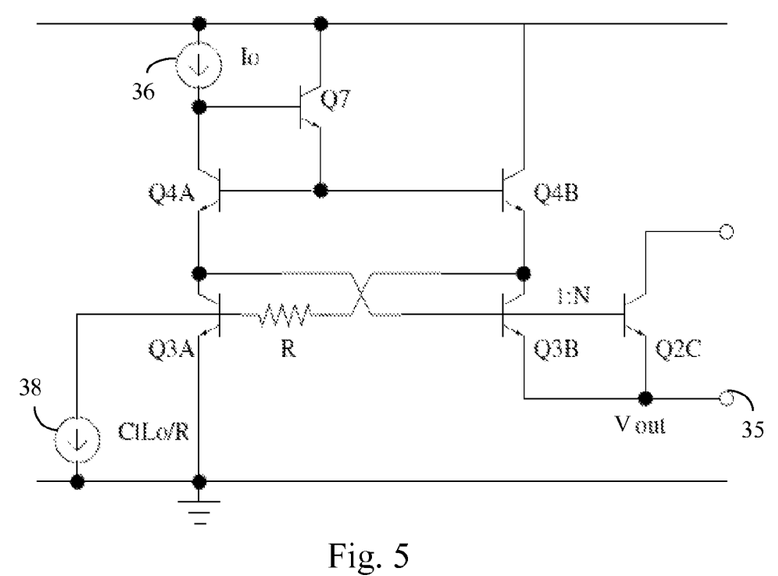
FIG. 5 illustrates an improvement to the clamp of FIG. 3 by adding a circuit to compensate for the base current of transistor Q4B.

The base current into transistor Q3A flows also through the resistor R and increases the voltage drop across the resistor R, causing the clamp voltage to rise (i.e., creates an offset between the actual clamp voltage during clamping and the desired clamp voltage). With a Io bias current of, for example, 1 mA, for a beta of 100, the base current into transistor Q3A may be 10 uA. Since the resistor R value is preferably high for minimal current consumption in the control portion 30, such as 20 Kohms, the offset may be as much as 200 mV.

Figure 6:
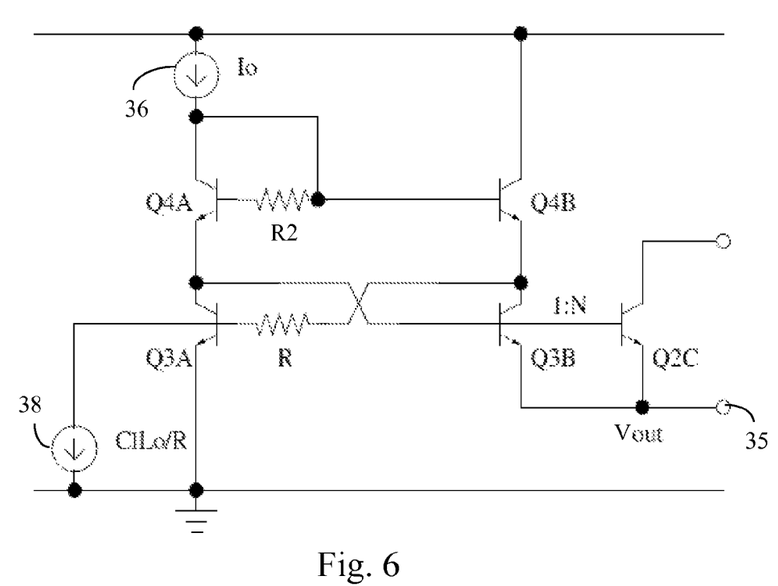
FIG. 6 illustrates an improvement to the clamp of FIG. 3 by adding a circuit to compensate for variations in voltage drop across the resistor due to the base current in the control portion.

FIG. 6 compensates for this additional voltage drop across the resistor R by adding a matched value resistor R2 between the bases of transistors Q4A and Q4B. The base current into transistor Q4A is supplied through the resistor R2 to increase the voltage drop across resistor R2 by the same amount that the voltage across resistor R decreases to compensate for the offset. Therefore, the clamp voltage does not change.

Figure 7:
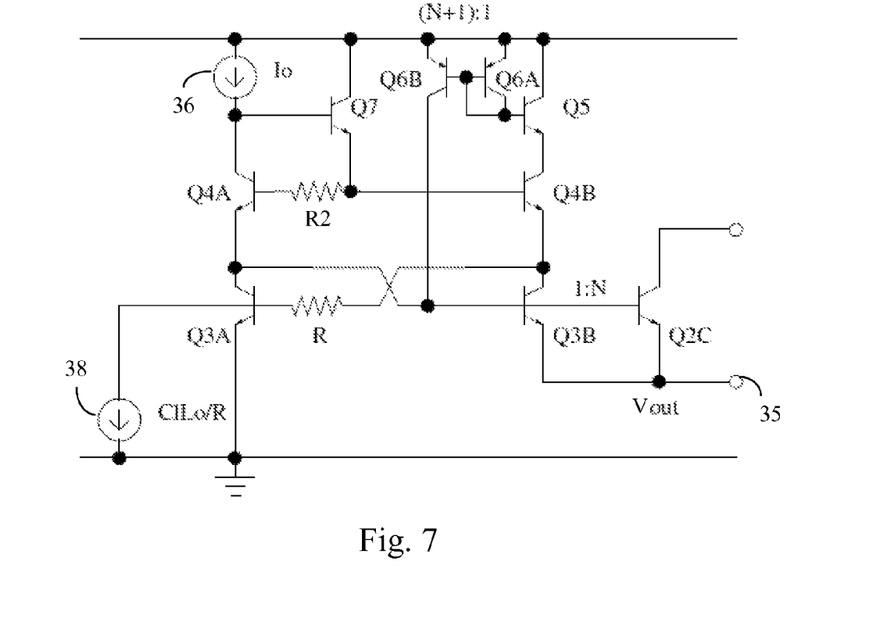
FIG. 7 combines the techniques of FIGS. 3-6 to minimize offset.

Any of the features described above for removing offset may be applied to the basic circuit of FIG. 3. FIG. 7 illustrates the clamp circuit of FIG. 3 modified to contain the compensation features of FIGS. 4, 5, and 6.

Figure 8:
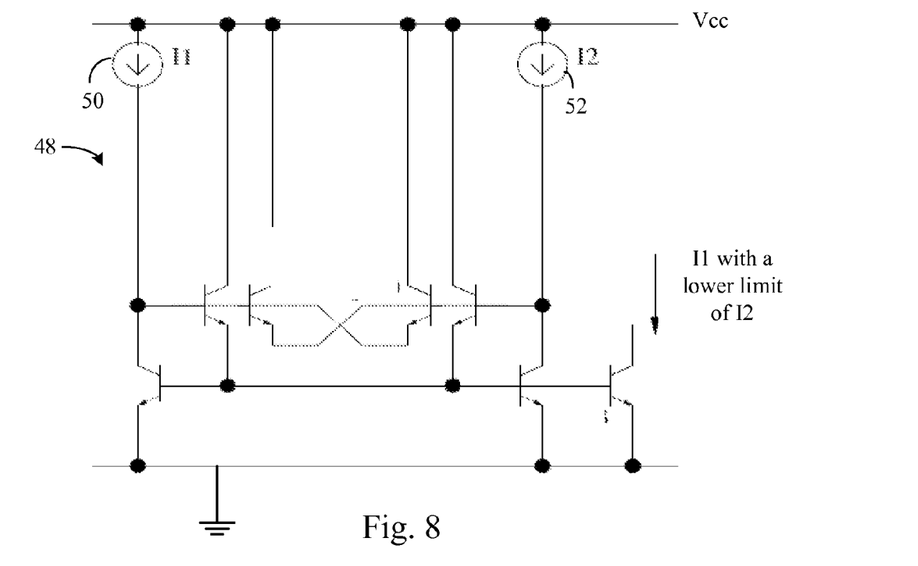
FIG. 8 illustrates a current source circuit, using a current minor and a current comparator, that may be used to generate the clamp current signal.

FIG. 8 illustrates a current source 48 that may be used for the clamp current source 38 in FIGS. 3-7, although any other current source may be used for the current source 38. The current source 48 contains two current sources 50 and 52. The current source 50 (generating a current I1) may be adjustable by the user and set to ClLo/R (previously described as the current generated by the current source 38) to select the clamp voltage. To prevent the clamp voltage from being set too low, such as a voltage that would cause the transistor QN2 in the output stage 17 of FIG. 2 to saturate during clamping, the current source 52 (generating a current I2) is set to Vmin/R, where Vmin is fixed at the minimum allowable clamp voltage. By avoiding saturation of the transistor QN2, the transistor QN2 can have quick recovery when the input voltage rises above the clamp voltage ClLo. The output current is therefore I1 with a lower limit of I2. The operation of the remainder of the current source 48 would be easily understood by those skilled in the art.

Figure 9:
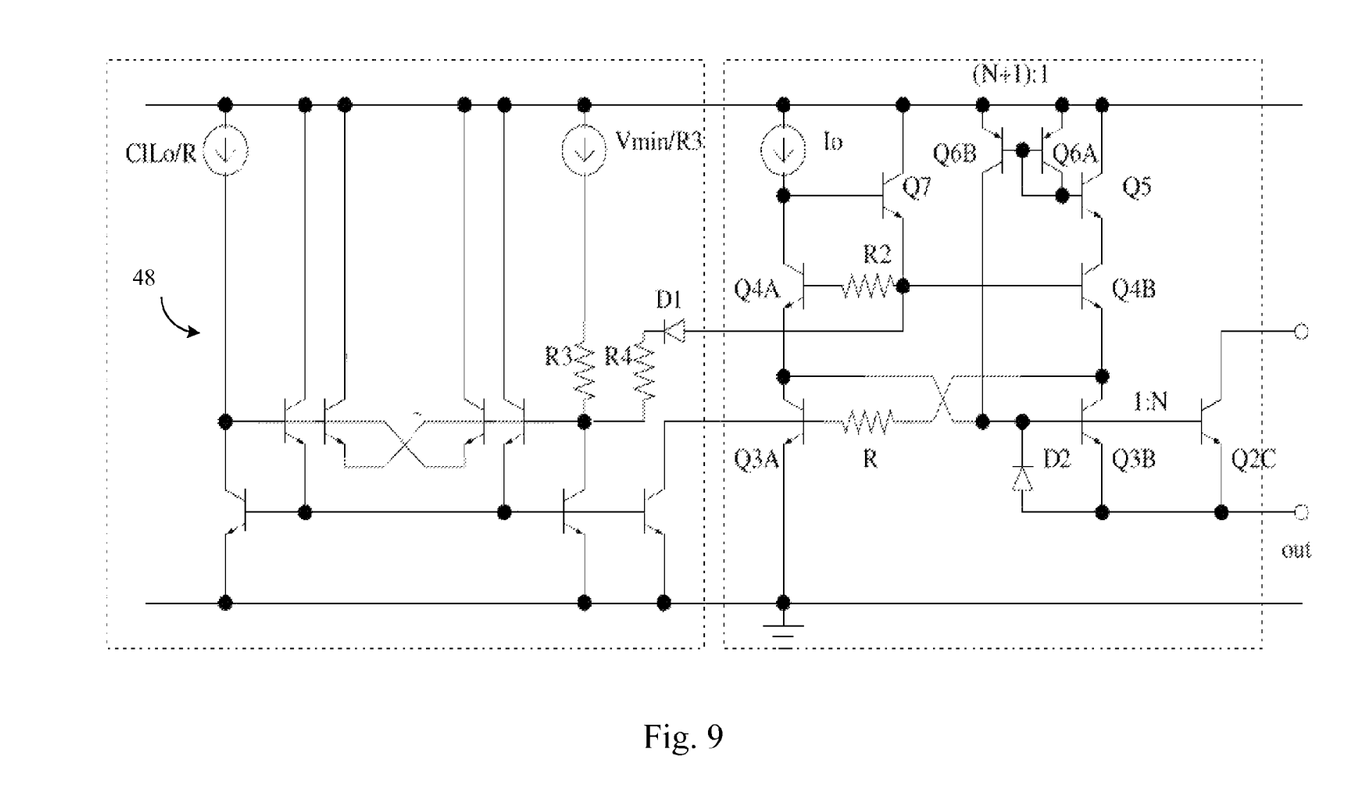
FIG. 9 illustrates a clamp circuit combining the circuit of FIG. 8 with the circuit of FIG. 7 plus the addition of diodes that protect the clamp transistor.

FIG. 9 illustrates a clamp circuit combining the current source 48 of FIG. 8, with resistor R3 added, and the clamp circuit of FIG. 7. In the event of a high output voltage and a low ClLo voltage, such as near ground, the diode D2 prevents the clamp transistor Q2C and Q3B from exceeding a reverse breakdown base-emitter voltage. Since this is outside the intended region of the clamp operation, this is a fault condition. Under such a fault condition, the diode D1 and resistor R4 provide the extra current required so the ClLo can track the output. Without diode D1 and resistor R4, the extra current would have to come out of the base of transistor Q3A. This would have resulted in a significant and undesirable increase in the collector current of transistor Q3A. While resistor R4 may be nominally matched to resistor R, its value can be optimized to adjust the transistor Q3A collector current during such a fault condition.

The entire circuit of FIG. 9 is preferably formed as a single integrated circuit.

Figure 10:
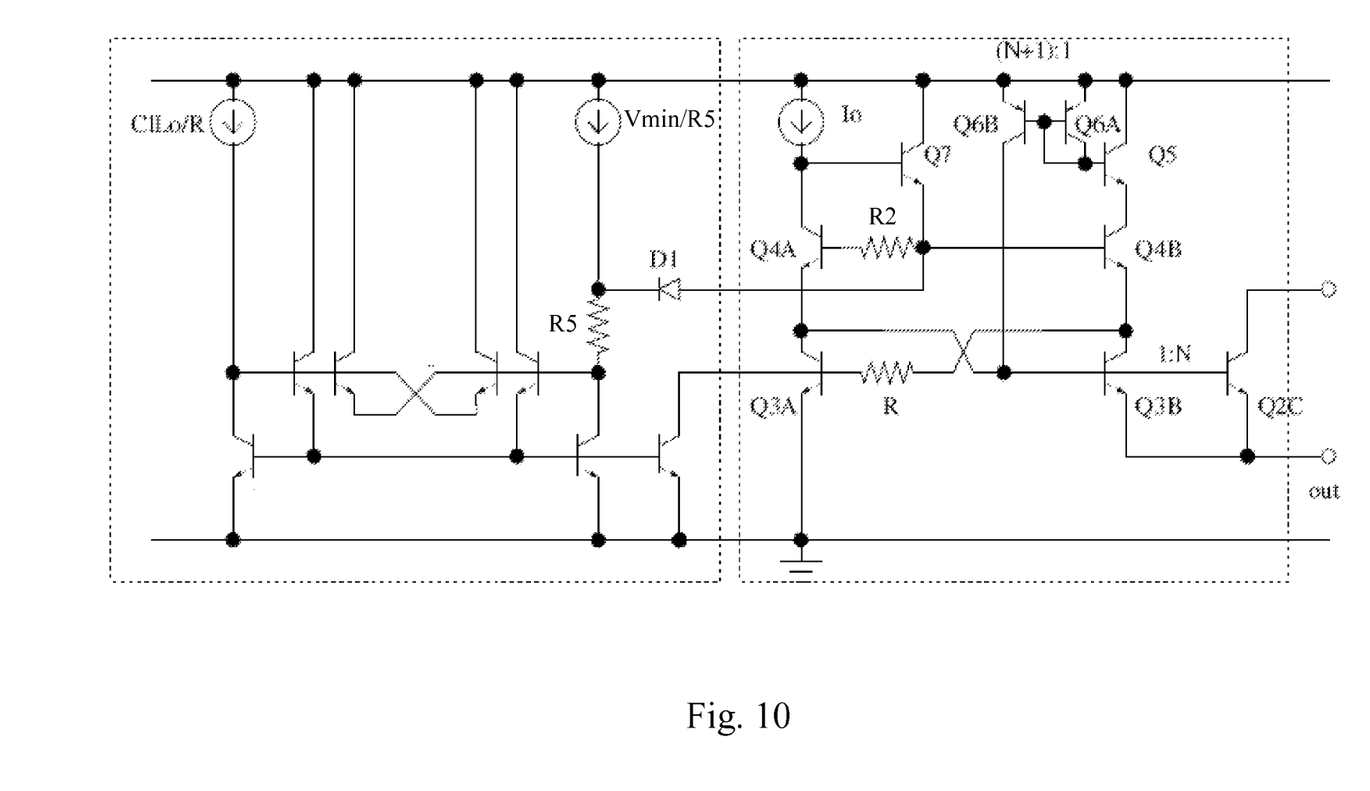
FIG. 10 is a variation of the circuit of FIG. 9.

As shown in FIG. 10, resistors R3 and R4 can be merged into a single resistor R5 without loss of functionality.

The present invention may be part of the buffer 10 in FIG. 1. In the preferred embodiment, the buffer 10 of FIG. 1 receives a high-side clamp voltage signal ClHi, set by the user, and a common mode signal Vcm, set by the user, identifying the intended midpoint between the differential input signals. The low-side clamp voltage (ClLo) is then automatically set by the buffer 10 by making the ClH1 and ClLo symmetrical around Vcm. In another embodiment, the user sets ClLo directly by an external signal.

Although an embodiment of the invention has been shown as a low side clamp, all transistors in all embodiments may be formed of opposite conductivity types (NPN or PNP), with the ground and positive power supply reversed to form a high side clamp.

The clamping circuit may also be implemented with non-bipolar transistors, such as MOSFETs, or combinations of bipolar and non-bipolar transistors. The resistors may be replaced with any type of resistive element, including a MOSFET. Additional circuit elements may be inserted between the components shown in the examples.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A low side clamping circuit having a control portion, a sense portion, and a bipolar clamp transistor, the circuit comprising:
   a first current source for generating a first current for setting a clamp voltage;
   a second current source for generating a second current through the control portion;
   an NPN bipolar first transistor in the sense portion having its collector coupled to a positive power supply voltage, wherein a voltage at its emitter substantially follows a voltage at its base;
   an NPN bipolar second transistor in the control portion having its collector coupled to the second current source, its emitter coupled to a base of the clamp transistor, and its base coupled to the base of the first transistor;
   an NPN bipolar third transistor in the control portion having its base coupled to the first current source, its collector coupled to the base of the clamp transistor, and its emitter coupled to ground;
   an NPN bipolar fourth transistor in the sense portion having its collector coupled to the emitter of the first bipolar transistor, its base coupled to the collector of the third transistor and to the base of the clamp transistor, and its emitter coupled to an emitter of the clamp transistor;
a first resistive element coupled in series between the first current source and the collector of the fourth transistor,
wherein, upon the first current source generating the first current, a first voltage is generated at the base of the fourth transistor, wherein the fourth transistor turns on when a voltage approximately equal to the clamp voltage is applied to an emitter of the fourth transistor, and wherein the clamp transistor turns on when the fourth transistor turns on to clamp the emitter of the clamp transistor at approximately the clamp voltage.

2. The circuit of claim 1 further comprising:
an NPN bipolar fifth transistor coupled between the collector of the first transistor and the positive power supply voltage;
a PNP bipolar sixth transistor coupled between the positive power supply voltage and a base of the fifth transistor; and
a PNP bipolar seventh transistor coupled between the positive power supply voltage and the base of the fourth transistor, wherein the sixth transistor and seventh transistors are connected as current minors.

3. The circuit of claim 1 further comprising a bipolar fifth transistor coupled between the base of the first transistor and the positive power supply voltage, a base of the fifth transistor being coupled to the second current source.

4. The circuit of claim 1 further comprising a second resistive element coupled between the base of the first transistor and the base of the second transistor, the base of the first transistor being coupled to the second current source.

5. The circuit of claim 1 further comprising:
a bipolar fifth transistor coupled between the collector of the first transistor and the positive power supply voltage;
a PNP bipolar sixth transistor coupled between the positive power supply voltage and a base of the fifth transistor;
a PNP bipolar seventh transistor coupled between the positive power supply voltage and the base of the fourth transistor, wherein the sixth transistor and seventh transistors are connected as current minors;
a second resistive element coupled between the base of the first transistor and the base of the second transistor; and
a bipolar eighth transistor coupled between the base of the first transistor and the positive power supply voltage, a base of the eighth transistor being coupled to the second current source.

6. A clamping circuit having a control portion, a sense portion, and a bipolar clamp transistor, the circuit comprising:
a first current source for generating a first current for setting a clamp voltage;
a second current source for generating a second current through the control portion;
a bipolar first transistor in the sense portion having its collector coupled to a first power supply voltage, wherein a voltage at its emitter substantially follows a voltage at its base;
a bipolar second transistor in the control portion having its collector coupled to the second current source, its emitter coupled to a base of the clamp transistor, and its base coupled to the base of the first transistor;
a bipolar third transistor in the control portion having its base coupled to the first current source, its collector coupled to the base of the clamp transistor, and its emitter coupled to a second power supply voltage;
a bipolar fourth transistor in the sense portion having its collector coupled to the emitter of the first bipolar transistor, its base coupled to the collector of the third transistor and to the base of the clamp transistor, and its emitter coupled to an emitter of the clamp transistor; and
a first resistive element coupled in series between the first current source and the collector of the fourth transistor,
wherein, upon the first current source generating the first current, a first voltage is generated at the base of the fourth transistor, wherein the fourth transistor turns on when a voltage approximately equal to the clamp voltage is applied to an emitter of the fourth transistor, and wherein the clamp transistor turns on when the fourth transistor turns on to clamp the emitter of the clamp transistor at approximately the clamp voltage.

7. The circuit of claim 6 further comprising:
a bipolar fifth transistor coupled between the collector of the first transistor and the positive power supply voltage;
a bipolar sixth transistor, of a conductivity type opposite to a conductivity type of the fifth transistor, coupled between the first power supply voltage and a base of the fifth transistor; and
a bipolar seventh transistor, of the same conductivity type as the sixth transistor, coupled between the first power supply voltage and the base of the fourth transistor, wherein the sixth transistor and seventh transistors are connected as current minors.

8. The circuit of claim 6 further comprising a bipolar fifth transistor coupled between the base of the first transistor and the first power supply voltage, a base of the fifth transistor being coupled to the second current source.

9. The circuit of claim 6 further comprising a second resistive element coupled between the base of the first transistor and the base of the second transistor, the base of the first transistor being coupled to the second current source.

10. The circuit of claim 6 further comprising:
a bipolar fifth transistor coupled between the collector of the first transistor and the first power supply voltage;
a bipolar sixth transistor, of a conductivity type opposite to a conductivity type of the fifth transistor, coupled between the first power supply voltage and a base of the fifth transistor;
a bipolar seventh transistor, of the same conductivity type as the sixth transistor, coupled between the first power supply voltage and the base of the fourth transistor, wherein the sixth transistor and seventh transistors are connected as current mirrors;
a second resistive element coupled between the base of the first transistor and the base of the second transistor; and
a bipolar eighth transistor coupled between the base of the first transistor and the first power supply voltage, a base of the eighth transistor being coupled to the second current source.

11. A clamping circuit having a control portion, a sense portion, and a bipolar clamp transistor, the circuit comprising:
a first current source for generating a first current for setting a clamp voltage;
a second current source, coupled to a first power supply voltage, for generating a second current through the control portion;
a first transistor in the sense portion having an emitter coupled to an emitter of the clamp transistor and having a base coupled to a base of the clamp transistor, the emitter of the clamp transistor being a clamping output terminal;
a second transistor in the control portion being connected in series between the second current source and a second power supply voltage, the first transistor and the second transistor being cross-coupled wherein a base of the first transistor is coupled to a collector of the second transistor, and a base of the second transistor is coupled to a collector of the first transistor, the base of the second transistor being coupled to the first current source; and a first resistive element coupled in series in series between the base of the second transistor and the collector of the first transistor, wherein, upon the first current source generating the first current, a first voltage is generated at the base of the first transistor, wherein the first transistor turns on when a voltage approximately equal to the clamp voltage is applied to the emitter of the first transistor, and wherein the clamp transistor turns on when the first transistor turns on to clamp the emitter of the clamp transistor at approximately the clamp voltage.

\* \* \* \* \*

UNITED STATES PATENT AND TRADEMARK OFFICE
CERTIFICATE OF CORRECTION

PATENT NO. : 8,446,203 B1  
APPLICATION NO. : 13/482760  
DATED : May 21, 2013  
INVENTOR(S) : Jozef Adut Page 1 of 1

It is certified that error appears in the above-identified patent and that said Letters Patent is hereby corrected as shown below:

In the Claims:

Column 7,  
Line 23, where "minors" should read --mirrors--.

Column 7,  
Line 40, where "minors" should read --mirrors--.

Column 8,  
Line 24, where "minors" should read --mirrors--.

Column 9,  
Line 4, where "in series in series" should read --in series--.

Signed and Sealed this  
Second Day of July, 2013

Teresa Stanek Rea  
*Acting Director of the United States Patent and Trademark Office*